United States Patent
Yoon et al.

(10) Patent No.: US 10,459,547 B2
(45) Date of Patent: Oct. 29, 2019

(54) CONDUCTIVE STRUCTURE AND METHOD FOR MANUFACTURING SAME

(71) Applicant: LG CHEM, LTD., Seoul (KR)

(72) Inventors: Junghwan Yoon, Daejeon (KR); Doohoon Song, Daejeon (KR); Song Ho Jang, Daejeon (KR); JinWoo Park, Daejeon (KR); Ki-Hwan Kim, Daejeon (KR)

(73) Assignee: LG CHEM, LTD, Seoul (KR)

( * ) Notice: Subject to any disclaimer, the term of this patent is extended or adjusted under 35 U.S.C. 154(b) by 273 days.

(21) Appl. No.: 15/533,544

(22) PCT Filed: Feb. 26, 2016

(86) PCT No.: PCT/KR2016/001950
§ 371 (c)(1),
(2) Date: Jun. 6, 2017

(87) PCT Pub. No.: WO2016/137282
PCT Pub. Date: Sep. 1, 2016

(65) Prior Publication Data
US 2018/0267638 A1     Sep. 20, 2018

(30) Foreign Application Priority Data
Feb. 26, 2015  (KR) .................. 10-2015-0027463

(51) Int. Cl.
| | | |
|---|---|---|
| *B32B 15/04* | (2006.01) | |
| *B32B 17/06* | (2006.01) | |
| *G06F 3/041* | (2006.01) | |
| *H01B 5/14* | (2006.01) | |
| *G02F 1/00* | (2006.01) | |
| *B32B 9/04* | (2006.01) | |

(52) U.S. Cl.
CPC .............. *G06F 3/041* (2013.01); *B32B 9/041* (2013.01); *G02F 1/00* (2013.01); *H01B 5/14* (2013.01); *B32B 2307/202* (2013.01); *B32B 2311/00* (2013.01); *B32B 2457/208* (2013.01); *G06F 2203/04103* (2013.01); *G06F 2203/04112* (2013.01); *H05K 2201/2054* (2013.01)

(58) Field of Classification Search
USPC ................................ 428/426, 432, 701, 702
See application file for complete search history.

(56) References Cited

U.S. PATENT DOCUMENTS

| | | | | |
|---|---|---|---|---|
| 5,942,349 | A * | 8/1999 | Badwal .............. | H01M 8/0208 427/115 |
| 6,416,194 | B1 * | 7/2002 | Demiryont ............. | C03C 17/36 359/359 |
| 2007/0074790 | A1 * | 4/2007 | Yamakoshi ............ | C22C 19/03 148/426 |
| 2007/0154561 | A1 * | 7/2007 | Takeda ..................... | A61K 8/19 424/489 |

(Continued)

FOREIGN PATENT DOCUMENTS

| | | |
|---|---|---|
| EP | 2747093 A2 | 6/2014 |
| JP | 2008227352 A | 9/2008 |

(Continued)

*Primary Examiner* — Lauren R Colgan
(74) *Attorney, Agent, or Firm* — Dentons US LLP

(57) ABSTRACT

The present specification relates to a conductive structure and a method for manufacturing the same.

20 Claims, 8 Drawing Sheets

(56) References Cited

U.S. PATENT DOCUMENTS

| | | | |
|---|---|---|---|
| 2007/0272439 A1* | 11/2007 | Kim | H05K 9/0092 |
| | | | 174/389 |
| 2008/0277157 A1* | 11/2008 | Naito | H01F 41/34 |
| | | | 174/392 |
| 2011/0003086 A1 | 1/2011 | Chung et al. | |
| 2012/0038564 A1* | 2/2012 | Kim | G06F 3/041 |
| | | | 345/173 |
| 2012/0187821 A1* | 7/2012 | Lee | H01L 51/5212 |
| | | | 313/498 |
| 2013/0068603 A1 | 3/2013 | Kwak | |
| 2013/0215067 A1* | 8/2013 | Hwang | G02B 5/003 |
| | | | 345/173 |
| 2014/0251429 A1* | 9/2014 | Lim | H01L 31/02246 |
| | | | 136/256 |
| 2015/0230343 A1* | 8/2015 | Takasawa | H05K 3/388 |
| | | | 174/255 |
| 2018/0018043 A1* | 1/2018 | Yoon | B32B 15/01 |
| 2018/0032167 A1* | 2/2018 | Fujimoto | B32B 15/08 |

FOREIGN PATENT DOCUMENTS

| | | |
|---|---|---|
| JP | 2008-311565 A | 12/2008 |
| JP | 2013148844 A | 8/2013 |
| JP | 2014-105362 A | 6/2014 |
| KR | 2009-0061225 A | 6/2009 |
| KR | 2010-0007605 A | 1/2010 |
| KR | 2012-0040680 A | 4/2012 |
| KR | 2014-0092679 A | 7/2014 |
| KR | 2014-0106145 A | 9/2014 |
| WO | 2011-149199 A2 | 12/2011 |

* cited by examiner

[FIG. 1]
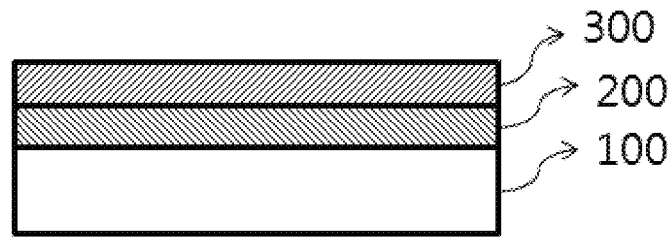
[FIG. 2]
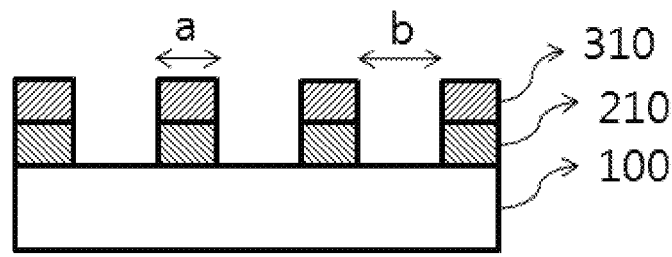
[FIG. 3]
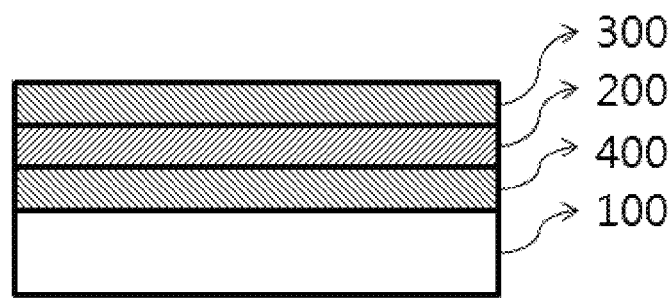
[FIG. 4]
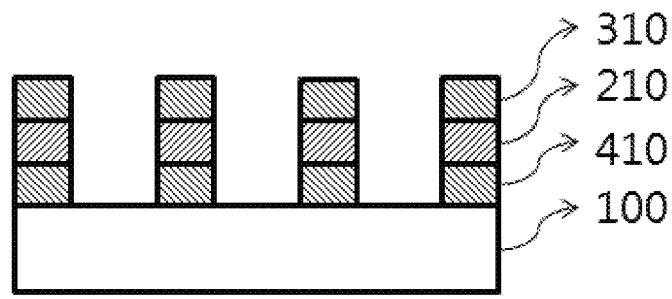

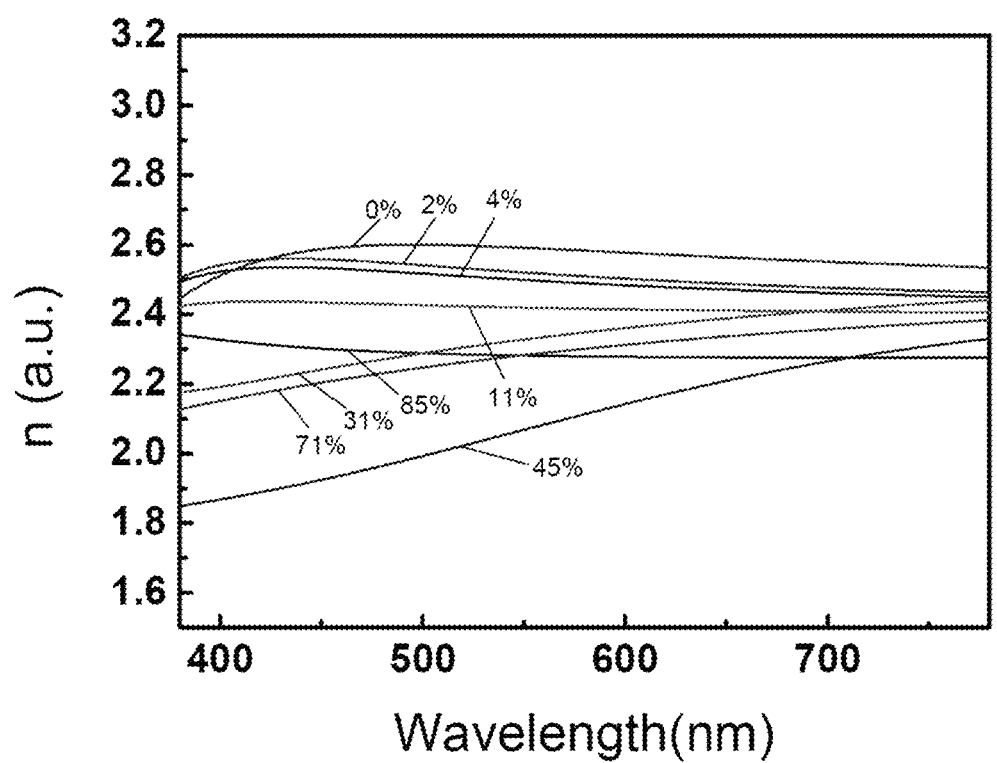
[FIG. 5]

[FIG. 6]
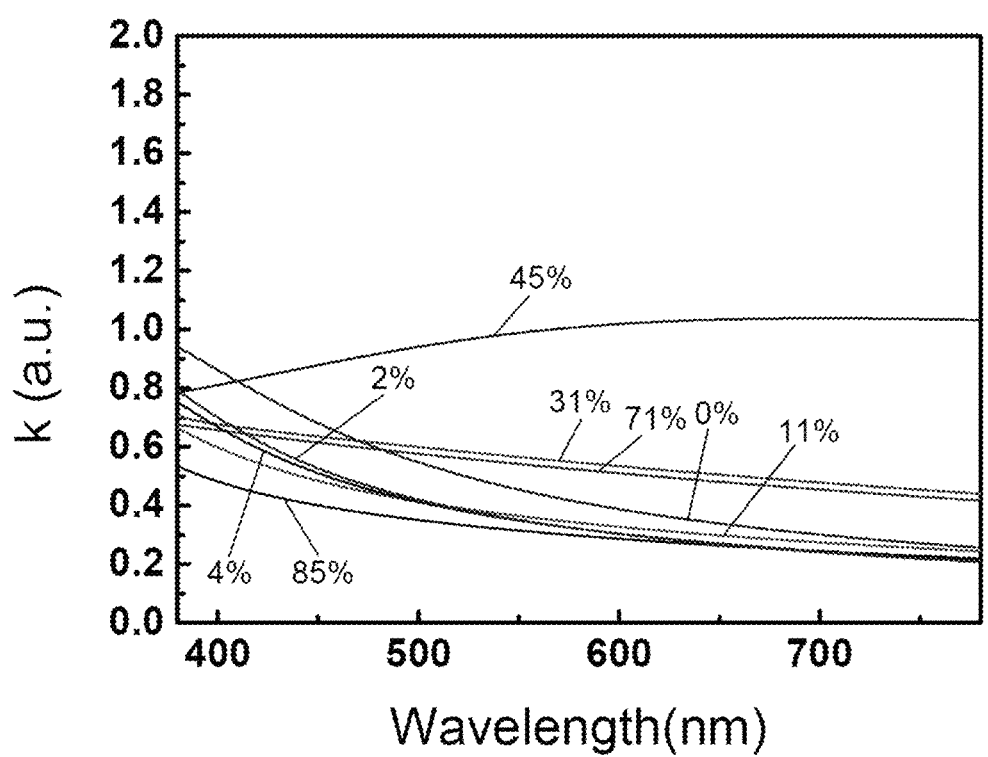

[FIG. 7]
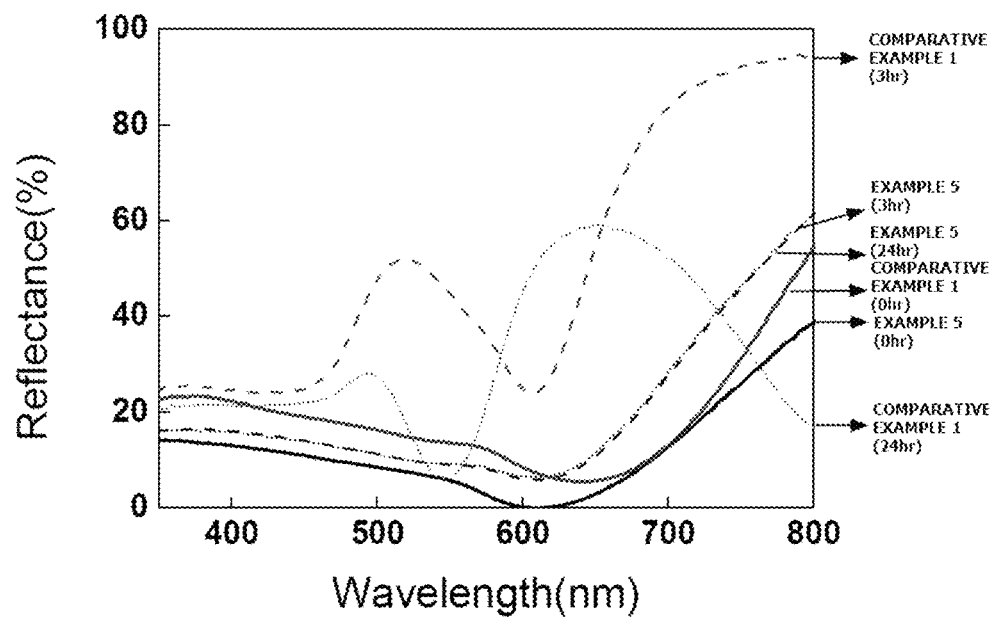
[FIG. 8]
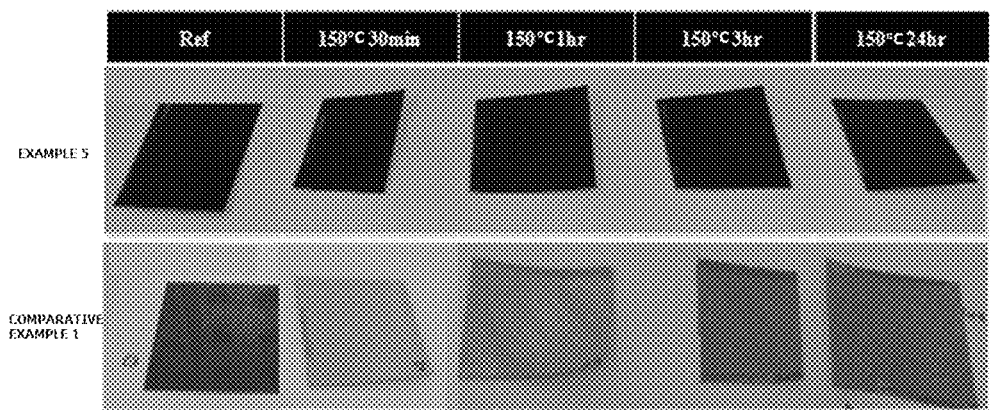

[FIG. 9]
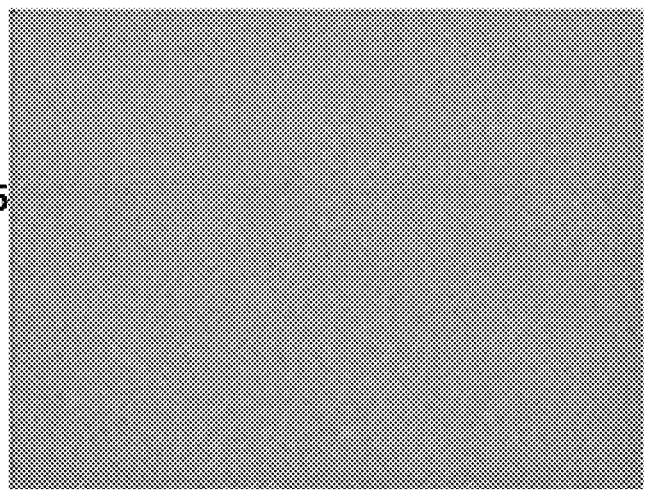
EXAMPLE 5
(ref. 0hr)
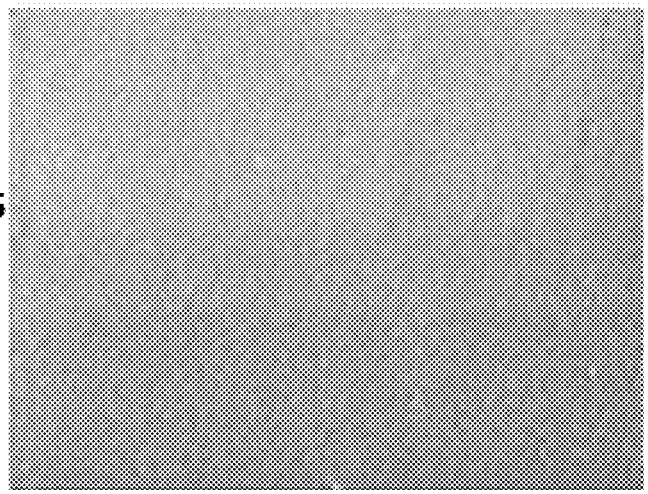
EXAMPLE 5
(3hr)

[FIG. 10]
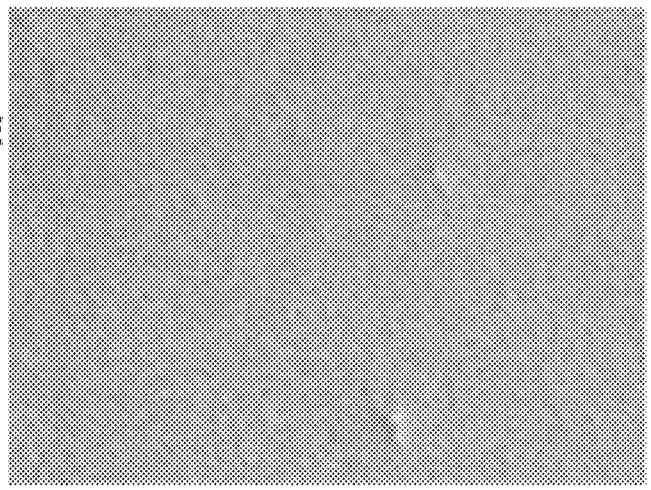
COMPARATIVE EXAMPLE 1 (ref. 0hr)
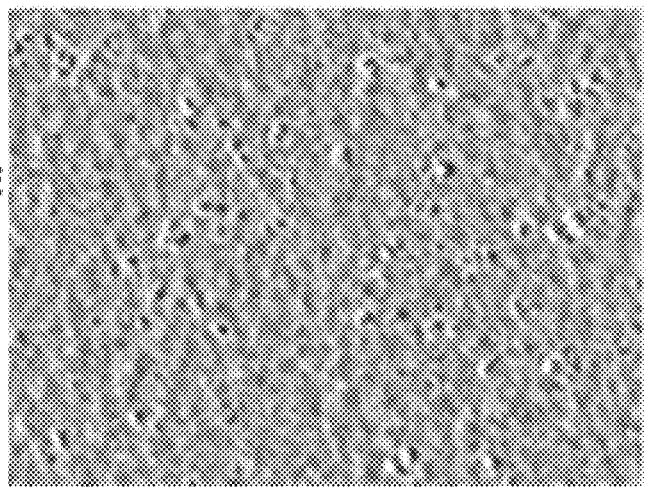
COMPARATIVE EXAMPLE 1 (3hr)

[FIG. 11]
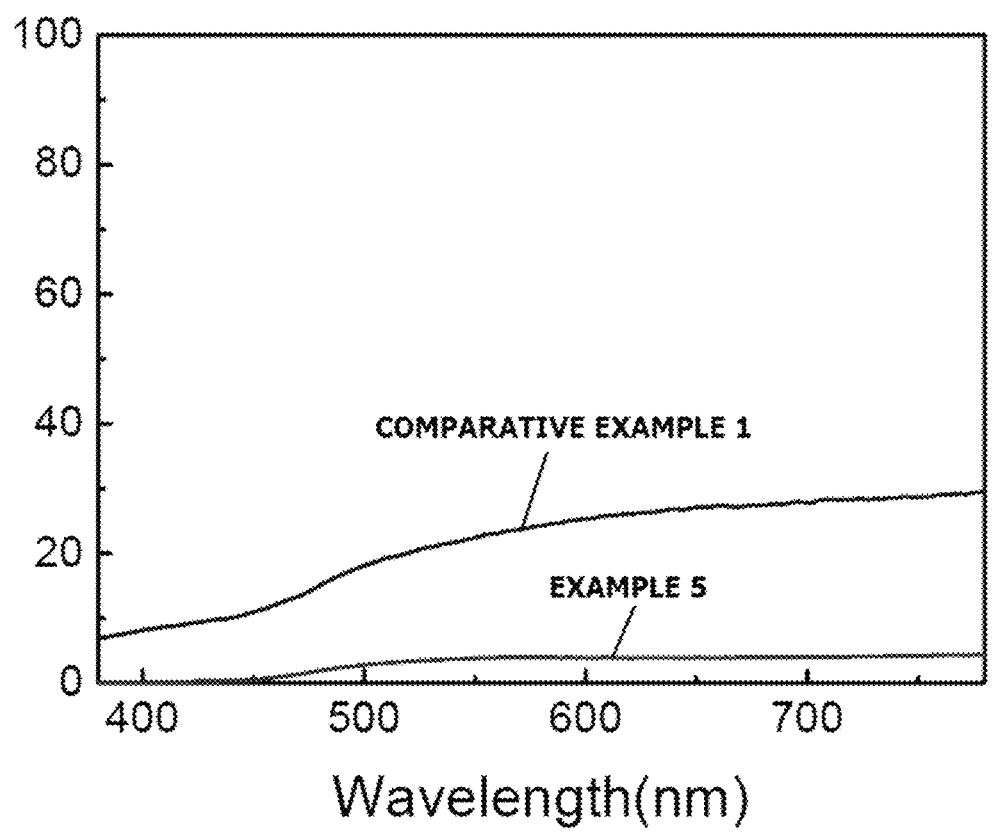

[FIG. 12]
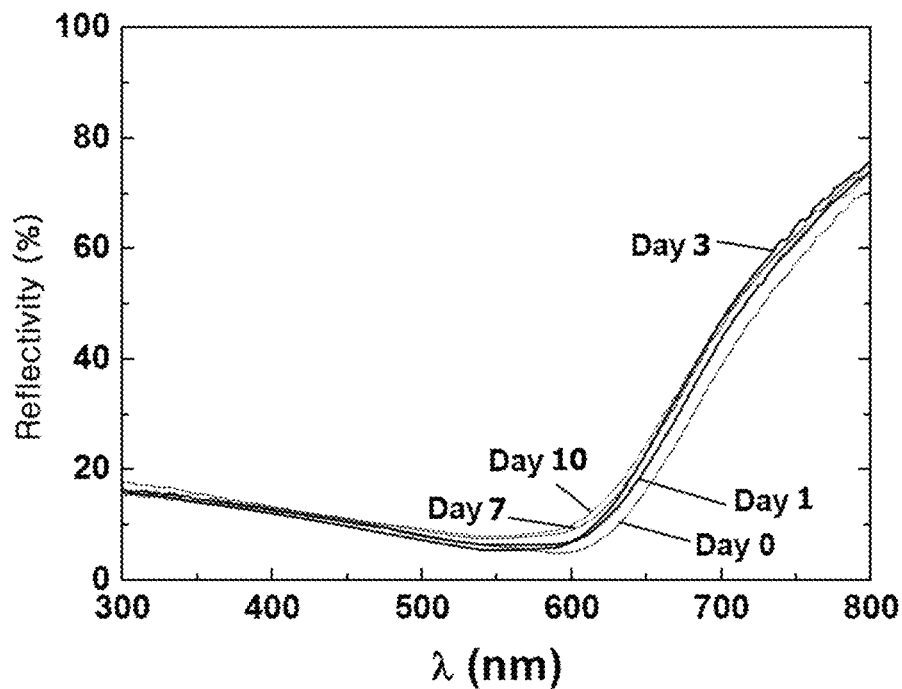
[FIG. 13]
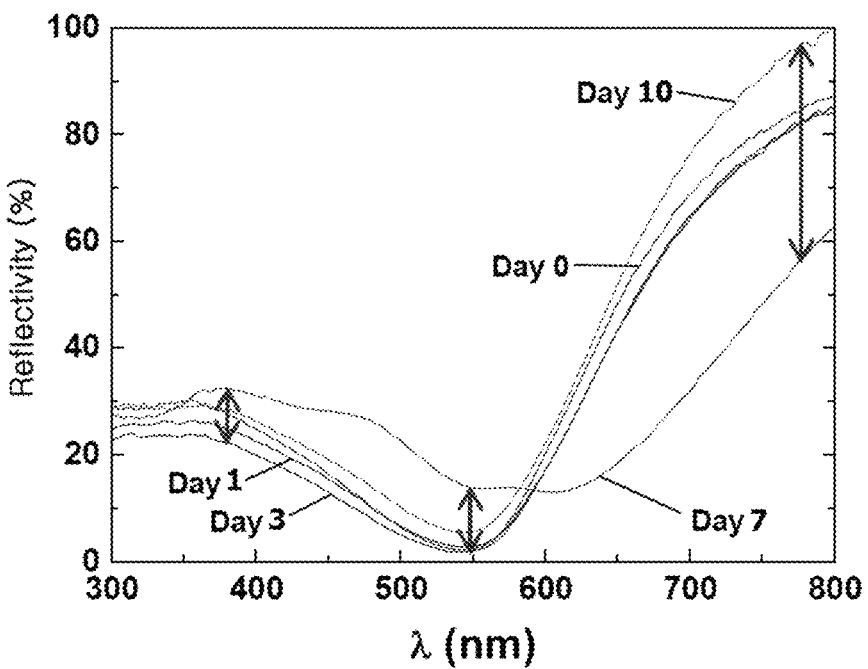

CONDUCTIVE STRUCTURE AND METHOD FOR MANUFACTURING SAME

TECHNICAL FIELD

This application is a National Stage Entry of International Application No. PCT/KR2016/001950, filed on Feb. 26, 2016, and claims the benefit of Korean Patent Application No. 10-2015-0027463, filed on Feb. 26, 2015, all of which are hereby incorporated by reference in their entirety for all purposes as if fully set forth herein.

The present specification relates to a conductive structure and a method for manufacturing the same.

BACKGROUND ART

Touch screen panels are generally divided into as follows depending on the signal detection type. In other words, the type comprises a resistive type sensing a location pressed by pressure through changes in a current or voltage value while a direct current voltage is applied, a capacitive type using capacitance coupling while an alternating current voltage is applied, and an electromagnetic type sensing a selected location as changes in a voltage while a magnetic field is applied.

As demands for large-area touch screen panels have recently increased, development of a technology accomplishing a large touch screen panel having excellent visibility while reducing electrode resistance has been required.

DISCLOSURE

Technical Problem

The present specification is directed to providing a conductive structure capable of being used in large area touch screen panels, minimizing performance decline in endurance of heat resistance, salt water resistance, and high temperature and high humidity environments, and maintaining excellent visibility in a range securing an etching property of a micropattem, and a method for manufacturing the same.

Technical Solution

One embodiment of the present specification provides a conductive structure comprising a substrate; a metal layer provided on the substrate; and a light reflection reducing layer comprising a copper-nickel oxide provided on at least one surface of the metal layer, wherein the light reflection reducing layer has copper content of 15 at % or more and 55 at % or less, and the light reflection reducing layer has nickel content of 1 at % or more and 30 at % or less.

Another embodiment of the present specification provides a method for manufacturing a conductive structure comprising preparing a substrate; forming a metal layer on the substrate; and forming a light reflection reducing layer that comprises a copper-nickel oxide on at least one surface of the metal layer, wherein the light reflection reducing layer has copper content of 15 at % or more and 55 at % or less, and the light reflection reducing layer has nickel content of 1 at % or more and 30 at % or less.

Still another embodiment of the present specification provides a touch panel comprising the conductive structure.

Yet another embodiment of the present specification provides a display device comprising the touch panel.

Advantageous Effects

A conductive structure according to one embodiment of the present specification has an advantage of maintaining excellent electrical conductivity and effectively preventing a dazzle effect of a metal layer.

A conductive structure according to one embodiment of the present specification has an advantage of having excellent visibility and having excellent chemical durability and physical durability.

A conductive structure according to one embodiment of the present specification is capable of minimizing a decrease in the electrical conductivity of the conductive structure caused by a process environment when used in electronic devices such as a display device.

A conductive structure according to one embodiment of the present specification is capable of obtaining a fine line width and thereby enhancing visibility.

A conductive structure according to one embodiment of the present specification is capable of preventing reflection caused by a metal layer without affecting conductivity of the metal layer, and enhancing a concealing property of the metal layer by enhancing absorbance. In addition, a touch screen panel having improved visibility, and a display device and a solar cell comprising the touch screen panel can be developed using the conductive structure according to one embodiment of the present specification.

DESCRIPTION OF DRAWINGS

FIG. 1 and FIG. 3 are diagrams illustrating a laminated structure of a conductive structure according to one embodiment of the present specification.

FIG. 2 and FIG. 4 are diagrams illustrating a laminated structure when patterning a conductive structure according to one embodiment of the present specification.

FIG. 5 shows results of measuring a refractive index (n) of a light reflection reducing layer of conductive structures manufactured according to examples and comparative examples.

FIG. 6 shows results of measuring an extinction coefficient (k) of a light reflection reducing layer of conductive structures manufactured according to examples and comparative examples.

FIG. 7 shows reflectivity of conductive structures before and after a heat resistance test according to Test Example 1-1.

FIG. 8 shows color changes in a light reflection reducing layer of conductive structures before and after a heat resistance test according to Test Example 1-1.

FIG. 9 shows surface conditions of a light reflection reducing layer of Example 5 before and 3 hours after a heat resistance test according to Test Example 1-1.

FIG. 10 shows surface conditions of a light reflection reducing layer of Comparative Example 1 before and 3 hours after a heat resistance test according to Test Example 1-1.

FIG. 11 shows transmittance of conductive structures after a salt water resistance test according to Test Example 2.

FIG. 12 shows changes in the light reflectivity of a conductive structure of Example 5 before and after an isothermal-isohumidity test according to Test Example 3.

FIG. 13 shows changes in the light reflectivity of a conductive structure of Comparative Example 1 before and after an isothermal-isohumidity test according to Test Example 3.

REFERENCE NUMERAL

100: Substrate
200: Metal Layer
210: Metal Pattern Layer
300: Light Reflection Reducing Layer
310: Light Reflection Reducing Pattern Layer
400: Additional Metal Layer
410: Patterned Additional Metal Layer

MODE FOR DISCLOSURE

In the present specification, a display device is a term collectively referring to televisions, computer monitors or the like, and comprises a display element forming an image and a case supporting the display element.

Examples of the display element comprise plasma display panels (PDP), liquid crystal displays (LCD), electrophoretic displays, cathode-ray tubes (CRT), OLED displays and the like. In the display element, an RGB pixel pattern for obtaining an image and an additional optical filter may be provided.

Meanwhile, relating to a display device, needs for a touch function in which a human hand directly becomes an input device without a separate input device such as a keyboard or a remote control have gradually increased as the propagation of smart phones, tablet PCs, IPTVs and the like has been accelerated. In addition, a multi-touch function capable of writing has been also required as well as specific point recognition.

Most touch screen panels (TSP) currently commercialized are based on a transparent conductive ITO thin film, but have problems such that a touch recognition speed becomes lower due to RC delay caused by relatively high surface resistance (minimum 150Ω/□, ELECRYSTA product manufactured by Nitto Denko Corporation) of a transparent ITO electrode itself when used in a large-area touch screen panel, and an additional compensation chip needs to be introduced in order to overcome such a problem.

Inventors of the present disclosure have studied a technology for replacing the transparent ITO thin film with a metal micropattern. In view of the above, the inventors of the present disclosure have found out that, when Ag, Mo/Al/Mo, MoTi/Cu and the like, which are metal thin films having high electrical conductivity, are used as an electrode of a touch screen panel, dazzle and the like may occur due to high reflectance and a haze value with respect to external light as well as a problem of a pattern being readily recognized by human eyes in terms of visibility due to high reflectance, when a specific-shaped micro electrode pattern is to be obtained. In addition, the inventors of the present disclosure have also found out that a high-priced target is required in the manufacturing process, or the process may often be complicated.

As a result, one embodiment of the present specification is to provide a conductive structure that may be differentiated from a touch screen panel using an existing ITO-based transparent conductive thin film layer, and may be used in a touch screen panel having an improved concealing property of a metal micropattern electrode and having improved reflection and diffraction properties with respect to external light.

Hereinafter, the present specification will be described in more detail.

In the present specification, a description of one member being placed "on" another member comprises not only a case of the one member adjoining the another member but a case of still another member being present between the two members.

In the present specification, a description of a certain part "comprising" certain constituents means capable of further comprising other constituents, and does not exclude other constituents unless particularly stated on the contrary.

In the present specification, "conductivity" means electrical conductivity.

In addition, in the present specification, "reflectivity" means light reflectivity, a "refractive index" means a light refractive index, and "absorptivity" means light absorptivity.

One embodiment of the present specification provides a conductive structure comprising a substrate; a metal layer provided on the substrate; and a light reflection reducing layer comprising a copper-nickel oxide provided on at least one surface of the metal layer, wherein the light reflection reducing layer has copper content of 15 at % or more and 55 at % or less, and the light reflection reducing layer has nickel content of 1 at % or more and 30 at % or less.

In the present specification, the at % is an atomic content ratio, and means atomic % used in the att.

FIG. 1 is a diagram illustrating a laminated structure of a conductive structure according to one embodiment of the present specification. Specifically, according to FIG. 1, a metal layer (200) and a light reflection reducing layer (300) are consecutively laminated on a substrate (100) in the conductive structure. However, the structure is not limited to the structure of FIG. 1, and additional layers may be further provided.

According to one embodiment of the present specification, the light reflection reducing layer may have nickel content of 2 at % or more and 25 at % or less. Specifically, according to one embodiment of the present specification, the light reflection reducing layer may have nickel content of 3 at % or more and 20 at % or less. When the light reflection reducing layer has nickel content in the above-mentioned range, the light reflection reducing layer stably exhibits low reflectivity. In addition, when the light reflection reducing layer has nickel content in the above-mentioned range, the light reflection reducing layer has excellent physical durability and chemical durability, and performance decline is minimized.

According to one embodiment of the present specification, the light reflection reducing layer may be formed with a three element-based component of copper, nickel and oxygen.

According to one embodiment of the present specification, the oxygen (O) content (at %) of the light reflection reducing layer may be the remainder with respect to the copper content and the nickel content in the light reflection reducing layer. Specifically, according to one embodiment of the present specification, the light reflection reducing layer may have oxygen content of 44 at % or more and 55 at % or less, and more specifically, the light reflection reducing layer may have oxygen content of 45 at % or more and 55 at % or less.

In addition, when the light reflection reducing layer has nickel content in the above-mentioned range, etching for patterning the light reflection reducing layer may be readily carried out. In other words, when the nickel content of the light reflection reducing layer is greater than the above-mentioned range, an etching property becomes worse leading to a problem of making patterning of the light reflection reducing layer difficult, and a problem of making batch etching with the metal layer difficult may occur. Specifically, when controlling the Ni content of the Cu—Ni source material to 1 wt % or more and 50 wt % or less, more specifically 2 wt % or more and 45 wt % or less, or 3 wt % or more and 35 wt % or less during sputtering to prepare the light reflection reducing layer, batch etching of the metal layer and the light reflection reducing layer may be favorably conducted. When the Ni content of the Cu—Ni source material is greater than 45 wt % during sputtering, an etching property of the light reflection reducing layer declines, and batch etching becomes difficult. The atomic content ratio (at %) of the light reflection reducing layer depending on the Ni content of the Cu—Ni source material may be as shown in Table 1 of the following examples.

According to one embodiment of the present specification, the light reflection reducing layer may be formed using a evaporation process under oxygen atmosphere using a Cu—Ni alloy source material. Specifically, when the Ni content of the Cu—Ni alloy is 1 wt % or more and 50 wt % or less, a light reflection reducing layer satisfying the above-mentioned atomic content ratio may be formed.

According to one embodiment of the present specification, a ratio of the nickel content to the copper content (Ni (at %)/Cu (at %)) in the light reflection reducing layer may be 0.01 or more and 1.8 or less. Specifically, according to one embodiment of the present specification, a ratio of the nickel content to the copper content (Ni (at %)/Cu (at %)) in the light reflection reducing layer may be 0.015 or more and 1.7 or less, or 0.019 or more and 1.7 or less. More specifically, according to one embodiment of the present specification, a ratio of the nickel content to the copper content (Ni (at %)/Cu (at %)) in the light reflection reducing layer may be 0.05 or more and 1 or less, 0.05 or more and 0.7 or less, or 0.06 or more and 0.7 or less.

According to one embodiment of the present specification, a refractive index (n) of the light reflection reducing layer may be 2 or more and 2.4 or less in light having a wavelength of 600 nm.

In addition, according to one embodiment of the present specification, a refractive index (n) of the light reflection reducing layer may be greater than 0 and less than or equal to 3, and more specifically 1.5 or more and 3 or less in light having a wavelength range of 380 nm to 780 nm. According to one embodiment of the present specification, a refractive index (n) the light reflection reducing layer may be 1.8 or more and 2.6 or less in light having a wavelength range of 380 nm to 780 nm.

According to one embodiment of the present specification, a thickness of the light reflection reducing layer may be determined depending on a refractive index with reference to the following Mathematical Equation 1.

$$d = \frac{\lambda}{4n} N (N = 1, 3, 5, \ldots)$$ [Mathematical Equation 1]

In Mathematical Equation 1, d is a thickness of the light reflection reducing layer, n is a refractive index, and $\lambda$ is a wavelength of light.

According to one embodiment of the present specification, the light reflection reducing layer may have an extinction coefficient (k) of 0.3 or more and 1.2 or less in light having a wavelength of 600 nm.

In addition, according to one embodiment of the present specification, the light reflection reducing layer may have an extinction coefficient (k) of 0.2 or more and 1 or less, and specifically 0.2 or more and 0.8 or less in light having a wavelength range of 380 nm to 780 nm.

When the extinction coefficient is within the above-mentioned range, reflectivity is further reduced having an effect of further enhancing performance of the light reflection reducing layer. Accordingly, a concealing property of the metal layer is further enhanced, and visibility may be even further improved when using the conductive structure in a touch screen panel.

In the conductive structure according to one embodiment of the present specification, the light reflection reducing layer has a higher extinction coefficient (k) compared to cases of using other materials such as aluminum oxy-nitrides or copper oxides, and therefore, there is an advantage in that the light reflection reducing layer may be prepared to have a small thickness.

The extinction coefficient may be measured using an Ellipsometer measuring instrument and the like known in the art.

The extinction coefficient k is also referral to as an absorption coefficient, and is a criterion capable of defining how strong a material may absorb light at a specific wavelength, and is a factor determining transmittance of a conductive structure. For example, a transparent dielectric material has a very small k value of k<0.2. However, as metal components increase inside the material, the k value increases. When metal components even further increase, a metal in which transmission hardly occurs, and only surface reflection mostly occurs is obtained, and an extinction coefficient k becomes greater than 2.5, which is not preferable in forming the light reflection reducing layer.

According to one embodiment of the present specification, reflectivity on the surface of the light reflection reducing layer may be 40% or less in light having a wavelength of 600 nm.

In addition, according to one embodiment of the present specification, total reflectivity of the conductive structure may be 20% or less in light having a wavelength of 380 nm to 780 nm. Specifically, total reflectivity of the conductive structure may be 15% or less, or 10% or less in light having a wavelength of 380 nm to 780 nm.

As the reflectivity and the total reflectivity decrease, the conductive structure has excellent visibility.

According to one embodiment of the present specification, the total reflectivity means reflectivity with respect to light having a region of 300 nm or more and 800 nm or less, and specifically 380 nm or more and 780 nm or less incident at 90° to the surface to measure after treating a surface opposite to the surface to measure with a black layer (perfect black). In the present specification, the total reflectivity is a value measured based on light having a region of 300 nm or more and 800 nm or less, and specifically 380 nm or more and 780 nm or less among reflected light reflected by a pattern layer subject to light incidence or a conductive structure when the incident light is employed as 100%.

When the light reflection reducing layer is provided between the metal layer and the substrate, the reflectivity may be measured from the substrate side. When total reflectivity is measured from the substrate side, the total reflectivity may be 20% or less, specifically 15% or less, and more specifically 10% or less. It is more effective as the total reflectivity is smaller.

In addition, when the metal layer is provided between the substrate and the light reflection reducing layer, the reflectivity may be measured from a direction opposite to the surface at which the light reflection reducing layer adjoins the metal layer. Specifically, when the light reflection reducing layer comprises a first surface adjoining the metal layer and a second surface opposite to the first surface, the reflectivity may be measured from the direction of the second surface. When measured from this direction, the total reflectivity may be 20% or less, specifically 15% or less, and more specifically 10% or less. It is more effective as the total reflectivity is smaller.

According to one embodiment of the present specification, the metal layer may be a metal pattern layer, and the light reflection reducing layer may be a light reflection reducing pattern layer. In addition, according to one embodiment of the present specification, when the metal layer is a metal pattern layer, the light reflection reducing layer may be provided as a light reflection reducing pattern layer on the metal pattern layer.

Herein, when total reflectivity of the conductive structure is measured from the second surface side of the light reflection reducing pattern layer, the total reflectivity (Rt) of the conductive structure may be calculated by the following Mathematical Equation 2.

Total reflectivity (Rt)=reflectivity of substrate+closure ratio×reflectivity of light reflection reducing layer   [Mathematical Equation 2]

In addition, in the case that the conductive structure has a structure in which two types of conductive structures are laminated, total reflectivity (Rt) of the conductive structure may be calculated by the following Mathematical Equation 3.

Total reflectivity (Rt)=reflectivity of substrate+closure ratio×reflectivity of light reflection reducing layer×2   [Mathematical Equation 3]

In Mathematical Equations 2 and 3, the total reflectivity of the substrate may be reflectivity of touch strengthened glass, and when the surface is a film, may be reflectivity of the film.

In addition, the closure ratio may be represented by the ratio of an area occupied by a region covered by the metal pattern layer and the light reflection reducing pattern layer based on the flat surface of the conductive structure, in other words, (1—opening ratio).

Accordingly, a difference between having the light reflection reducing pattern layer and not having the light reflection reducing pattern layer is dependent on the reflectivity of the light reflection reducing pattern layer. In this regard, the total reflectivity (Rt) of the conductive structure according to one embodiment of the present specification may be reduced by 10% to 20%, may be reduced by 20% to 30%, may be reduced by 30% to 40%, may be reduced by 40% to 50%, and may be reduced by 50% to 70% compared to the total reflectivity (RO) of a conductive structure having the same constitution except that the conductive structure does not comprise the light reflection reducing pattern layer. In other words, when the total reflectivity range varies from 1% to 30% while varying the closure ratio range from 1% to 10% in Mathematical Equations 2 and 3, a reflectivity decrease effect of maximum 70% may be obtained, and a total reflectivity decrease effect of minimum 10% may be obtained.

In the conductive structure according to one embodiment of the present specification, the light reflection reducing pattern layer comprises a first surface adjoining the metal pattern layer and a second surface opposite to the first surface, and when total reflectivity of the conductive structure is measured from the second surface side of the light reflection reducing pattern layer, a difference between the total reflectivity (Rt) of the conductive structure and the reflectivity (RO) of the substrate may be 40% or less, 30% or less, 20% or less, or 10% or less.

According to one embodiment of the present specification, the conductive structure may have a brightness value (L*) of 50 or less based on the Commission Internationale de l'Eclairage (CIE) L*a*b* color coordinates, and more specifically, 40 or less. It is more effective as the brightness value is smaller since reflectivity decreases.

According to one embodiment of the present specification, there may be almost no pinholes in the conductive structure, and even when the pinholes are present, the diameter may be 3 μm or less, and more specifically 1 μm or less. When the diameter of the pinholes is 3 μm or less in the conductive structure, the occurrence of disconnection may be prevented. In addition, when there are almost no pinholes in the conductive structure and the number of the pinholes is very small, the occurrence of disconnection may be prevented.

According to one embodiment of the present specification, the light reflection reducing layer may have a thickness of 10 nm or more and 100 nm or less. Specifically, according to one embodiment of the present specification, the light reflection reducing layer may have a thickness of 20 nm or more and 60 nm or less. More specifically, according to one embodiment of the present specification, the light reflection reducing layer may have a thickness of 30 nm or more and 60 nm or less.

The light reflection reducing layer having a thickness in the above-mentioned range may be relatively advantageous in terms of process control and production rate. In addition, when the light reflection reducing layer has a thickness in the above-mentioned range, a darkening effect is excellent since total reflectivity of the conductive structure may be 20% or less, specifically 15% or less, and more specifically 10% or less in a light having a wavelength of 380 nm to 780 nm. In addition, when the light reflection reducing layer has a thickness in the above-mentioned range, an effect of preventing corrosion of the metal layer is excellent, and the light reflection reducing layer may be readily patterned to have uniform line width and thickness.

The light reflection reducing layer having a thickness of less than 10 nm may cause a problem in that physical and chemical damages on the metal layer may not be sufficiently prevented. In addition, the light reflection reducing layer having a thickness of greater than 100 nm may cause a problem in that the light reflection reducing layer is difficult to pattern.

According to one embodiment of the present specification, an amount of change in the average light reflectivity of the light reflection reducing layer in a wavelength range of 380 nm to 780 nm may be 10% or less after 24 hours under a high temperature atmosphere of 150° C.

The high temperature atmosphere may use a general box oven, and relative humidity herein may be approximately 20%.

The amount of change in the average light reflectivity (%) may be calculated by ((average light reflectivity after going through the high temperature atmosphere/initial average light reflectivity)−1)×100.

The initial average light reflectivity means average light reflectivity of the light reflection reducing layer prior to going through the high temperature atmosphere.

Such a high temperature atmosphere may be the same as a process of crystallizing a transparent electrode layer when the transparent electrode layer is an ITO film, and under such a condition, the light reflection reducing layer may perform a role of not only suppressing oxidation of the metal layer, but minimizing performance decline of the light reflection reducing layer.

According to one embodiment of the present specification, light transmittance of the light reflection reducing layer may be 20% or less in light having a wavelength of 600 nm after 12 hours under an atmosphere of 25° C. and 5 mass % of NaCl solution spray.

According to one embodiment of the present specification, an amount of change in the average light reflectivity of the light reflection reducing layer may be 20% or less after 10 days under a high temperature-high humidity atmosphere of 85° C. and relative humidity of 85%.

The amount of change in the average light reflectivity (%) may be calculated by ((average light reflectivity after going through the high temperature–high humidity atmosphere/initial average light reflectivity)−1)×100.

The initial average light reflectivity means average light reflectivity of the light reflection reducing layer prior to going through the high temperature-high humidity atmosphere.

In the conductive structure of one embodiment of the present specification, changes in the physical properties of the light reflection reducing layer are not high even when the conductive structure goes through the high temperature atmosphere, the NaCl solution spray atmosphere, or the high temperature-high humidity atmosphere, and therefore, excellent durability may be exhibited during a manufacturing process of the conductive structure, a distribution process thereof, and a process of applying and using the conductive structure in electronic devices.

The conductive structure according to one embodiment of the present specification has improved effects compared to a conductive structure comprising a light reflection reducing layer comprising a copper oxide. The light reflection reducing layer comprising a copper oxide has a problem in that reflectivity may increase with time since the light reflection reducing layer may be discolored under a high temperature and high humidity condition by a phase change of the copper oxide. However, the light reflection reducing layer of the conductive structure according to one embodiment of the present specification does not experience a phase change even under a high temperature and high humidity condition, and therefore, discoloration of the light reflection reducing layer may be prevented. Accordingly, in the conductive structure according to one embodiment of the present specification, the light reflection reducing layer is not discolored under a high temperature and high humidity condition even after a long period of time, and therefore, there is an advantage in that low reflectivity may be maintained, and a stable conductive structure may be provided.

According to one embodiment of the present specification, the metal layer may be a metal pattern layer comprising a plurality of openings and a conductive line dividing the openings.

According to one embodiment of the present specification, the light reflection reducing layer may be provided on at least one surface of the conductive line. Specifically, according to one embodiment of the present specification, when the metal layer is a metal pattern layer, the light reflection reducing layer may be provided on the conductive line of the metal pattern layer. More specifically, according to one embodiment of the present specification, the light reflection reducing layer may be a light reflection reducing pattern layer provided on the metal pattern layer.

According to one embodiment of the present specification, the metal pattern layer and the light reflection reducing pattern layer may form a regular pattern or an irregular pattern. Specifically, the metal pattern layer and a darkening pattern layer may be provided while forming a pattern on the substrate through a patterning process.

Specifically, the pattern may have a polygonal form such as a triangle or a quadrangle, a circular, an oval or an amorphous form. The triangle may comprise an equilateral triangle, a right triangle or the like, and the quadrangle may comprise an equilateral quadrangle, a right quadrangle, a trapezoid or the like.

As the regular pattern, pattern forms used in the art such as a mesh pattern may be used. The irregular pattern is not particularly limited, and may have a boundary line form of figures forming a voronoi diagram. According to one embodiment of the present specification, when the pattern form is an irregular pattern, a diffraction pattern of reflected light due to illumination having directivity may be removed by the irregular pattern, and influences due to light scattering may be minimized by the light reflection reducing pattern layer, therefore, problems in visibility may be minimized.

According to one embodiment of the present specification, the light reflection reducing layer may be provided on a surface opposite to the surface at which the conductive line adjoins the substrate.

FIG. 2 is a diagram illustrating a laminated structure when patterning the conductive structure according to one embodiment of the present specification. Specifically, according to FIG. 2, a metal pattern layer (210) and a light reflection reducing pattern layer (310) are consecutively provided on a substrate (100) in the conductive structure. However, the structure is not limited to the structure of FIG. 2, and additional layers may be further provided.

In FIG. 2, a means a line width of the pattern layer, and b means line spacing between adjoining conductive lines of the pattern layer.

According to one embodiment of the present specification, the metal pattern layer may have a line width of 0.1 μm or more and 100 μm or less. Specifically, according to one embodiment of the present specification, the metal pattern layer may have a line width of 0.1 μm or more and 50 μm or less, 0.1 μm or more and 30 μm or less, or 0.1 μm or more and 10 μm or less, however, the line width is not limited thereto. The line width of the metal pattern layer may be designed depending on the final application of the conductive structure.

When the line width is less than 0.1 μm, patterns may be difficult to obtain, and when greater than 100 μm, visibility may decrease.

The light reflection reducing pattern layer may have the same pattern shape with the metal pattern layer. However, the pattern size of the light reflection reducing pattern layer does not have to be completely the same as the pattern size of the metal pattern layer, and cases in which the pattern line width in the light reflection reducing pattern layer is narrower or wider than the pattern line width in the metal pattern layer are also comprised in the scope of the present specification. Specifically, the pattern line width in the light reflection reducing pattern layer may be 80% or more and 120% or less of the pattern line width in the metal pattern layer. In addition, an area provided with a pattern in the light reflection reducing pattern layer is specifically 80% or more and 120% or less of an area provided with a pattern in the metal pattern layer. More specifically, a pattern shape of the light reflection reducing pattern layer is preferably a pattern shape having the same or a lager pattern line width compared to a pattern line width in the metal pattern layer.

When the light reflection reducing pattern layer has a pattern shape having a larger line width than a line width of the metal pattern layer, an effect of the light reflection reducing pattern layer screening the metal pattern layer is bigger when a user looks, therefore, there is an advantage in that an effect caused by luster or reflection of the metal pattern layer itself may be efficiently blocked. However, a target effect of the present specification may also be achieved when a pattern line width in the light reflection reducing pattern layer is the same as a pattern line width in the metal pattern layer.

According to one embodiment of the present specification, line spacing between adjoining conductive lines of the metal pattern layer may be 0.1 μm or more and 100 μm or less. According to one embodiment of the present specification, the line spacing may be 0.1 μm or more, more specifically 10 μm or more, and even more specifically 20 μm or more. In addition, according to one embodiment of the present specification, the line spacing may be 100 μm or less and more specifically 30 μm or less.

According to one embodiment of the present specification, the metal pattern layer and the light reflection reducing pattern layer may be obtained as a pattern with a fine line width, and therefore, have an advantage of having excellent visibility when used as an electrode of a touch panel of a display device.

According to one embodiment of the present specification, the metal layer may comprise one or more selected from the group consisting of copper, aluminum, silver, neodymium, molybdenum, nickel, alloys comprising two or more thereof, oxides comprising one or more thereof and nitrides comprising one or more thereof. Specifically, according to one embodiment of the present specification, the metal layer may comprise copper. According to one embodiment of the present specification, the metal layer may be formed with copper. In addition, according to one embodiment of the present specification, the metal layer may comprise copper as a main component. However, some impurities may be comprised during a manufacturing process.

Copper has excellent electrical conductivity and low resistance, and may be used as a wiring electrode on the top of a transparent electrode layer. However, copper has low activation energy and has a very large potential value to be reduced to neural metal, and is very likely to obtain electrons to be oxidized. Accordingly, when only a copper layer is present on the top of the transparent electrode layer, the copper layer may be oxidized or corroded leading to a problem of increasing surface resistance under a high temperature and high humidity environment. In addition, adhesion to the transparent electrode layer is low and surface strength is also low, and accordingly, mechanical properties are not favorable.

In view of such problems, the conductive structure according to one embodiment of the present specification is provided with a metal layer comprising copper and the light reflection reducing layer, and may prevent oxidation and corrosion of the metal layer. Accordingly, the conductive structure according to one embodiment of the present specification has excellent chemical durability. Furthermore, the conductive structure has an advantage of having excellent mechanical properties as well.

According to one embodiment of the present specification, the metal layer may be formed using methods known in the art. For example, methods such as evaporation, sputtering, wet coating, vaporization, electroplating or electroless plating, and metal foil lamination may be used for the formation.

In addition, according to one embodiment of the present specification, the metal layer may be also formed using a printing method. When the metal layer is formed using a printing method, an ink or paste comprising a metal may be used, and the paste may further comprise a binder resin, a solvent, a glass frit and the like in addition to the metal.

According to one embodiment of the present specification, the metal layer may have a thickness of 100 nm or greater, and more specifically, 150 nm or greater. In addition, according to one embodiment of the present specification, the metal layer may have a thickness of 500 nm or less, and more specifically, 200 nm or less. Electrical conductivity is dependent on the thickness in the metal layer, and when the metal layer is very thin, a continuous thickness is not formed causing a problem of increasing a specific resistance value, and the metal layer may have a thickness of 100 nm or greater.

According to one embodiment of the present specification, an additional metal layer may be further comprised between the substrate and the metal layer.

According to one embodiment of the present specification, the additional metal layer may comprise two or more metals selected from the group consisting of copper, aluminum, neodymium, molybdenum, titanium and nickel. Specifically, the additional metal layer may comprise Cu—Ni.

The additional metal layer may perform a role of minimizing a decrease in the electrical conductivity of the conductive structure, and enhancing adhesion between the substrate and the metal layer.

According to one embodiment of the present specification, the conductive structure may have a structure in which the substrate, the metal layer and the light reflection reducing layer are consecutively laminated in this order; a structure in which the substrate, the light reflection reducing layer and the metal layer are consecutively laminated in this order; or a structure in which the substrate, the light reflection reducing layer, the metal layer and the light reflection reducing layer are consecutively laminated in this order.

According to one embodiment of the present specification, the laminated structure of the conductive structure may comprise a structure of a substrate/a light reflection reducing pattern layer/a metal pattern layer, a structure of a substrate/a metal pattern layer/a light reflection reducing pattern layer, a structure of a substrate/a light reflection reducing pattern layer/a metal pattern layer/a light reflection reducing pattern layer, a structure of a substrate/a metal pattern layer/a light reflection reducing pattern layer/a metal pattern layer, a structure of a substrate/a light reflection reducing pattern layer/a metal pattern layer/a light reflection reducing pattern layer/a metal pattern layer/a light reflection reducing pattern layer, a structure of a substrate/a light reflection reducing pattern layer/a metal pattern layer/a light reflection reducing pattern layer/a metal pattern layer/a light reflection reducing pattern layer/a metal pattern layer/a light reflection reducing pattern layer, and the like.

In the present specification, the light reflection reducing layer may be a light reflection reducing pattern layer. In addition, in the present specification, the metal layer may be a patterned metal pattern layer. The light reflection reducing layer may be patterned simultaneously or separately with the metal layer.

In the present specification, the light reflection reducing layer may be provided on at least one surface of the metal layer. Specifically, the light reflection reducing layer may be provided on any one surface of the metal layer, or may also be provided on both surfaces of the metal layer.

According to one embodiment of the present specification, the metal layer may be provided between a substrate and a light reflection reducing layer. Specifically, the conductive structure may comprise a substrate; a metal layer provided on the substrate; and a light reflection reducing layer provided on the metal layer. In addition, according to one embodiment of the present specification, the light reflection reducing layer may be provided on at least part of an upper surface and a side surface of the metal layer. Specifically, when the conductive structure is used in a display unit of an electronic device and is recognized from the outside through a surface opposite to the substrate, the light reflection reducing layer may play a role of preventing dazzle of the metal layer.

In the conductive structure according to one embodiment of the present specification, the light reflection reducing layer may be provided between a substrate and a metal layer. Specifically, the conductive structure may comprise a substrate; a light reflection reducing layer provided on the substrate; and a metal layer provided on the light reflection reducing layer. Specifically, when the conductive structure is used in a display unit of an electronic device and is recognized from the outside through the substrate, the light reflection reducing layer may play a role of preventing dazzle of the metal layer.

The light reflection reducing layer may not only play a role of preventing corrosion of the metal layer, but also play a role of preventing a dazzle effect caused by the metal layer when the metal layer is used in a display unit of an electronic device.

The inventors of the present disclosure have found out that, in a touch screen panel comprising a conductive metal micropattern provided in an effective screen unit, properties of light reflection and refraction made by the conductive metal micropattern have a major influence on the visibility of the conductive metal micropattern, and have made an effort to improve this. Specifically, in a touch screen panel based on existing ITO, a problem caused by reflectance of a conductive pattern has not been significantly revealed due to high transmittance of the ITO itself, however, in a touch screen panel comprising a conductive metal micropattern provided in an effective screen unit, reflectance and a light reflection reducing property of the conductive metal micropattern are important.

When using the conductive structure according to one embodiment of the present specification in a touch screen panel, a visibility decline problem caused by high reflectance of the metal layer may be significantly improved.

Specifically, the light reflection reducing layer has a light absorbing property, and therefore, is capable of reducing the reflectance caused by the metal layer by reducing the amount of the light incident to the metal layer itself and the amount of the light reflected from the metal layer. In addition, the light reflection reducing layer may have low reflectance compared to the metal layer. As a result, light reflectance may be reduced compared to cases in which a user directly looks at the metal layer, and therefore, visibility of the conductive structure may be significantly improved.

According to one embodiment of the present specification, the light reflection reducing layer may further comprise a transition layer having two or more elements, and in which one elemental composition ratio increases by approximately a maximum of 20% per 100Ω depending on the direction to which external light enters. Herein, the one element may comprise a metal element such as nickel (Ni), vanadium (V), tungsten (W), tantalum (Ta), molybdenum (Mo), niobium (Nb), titanium (Ti), iron (Fe), chromium (Cr), cobalt (Co), aluminum (Al) or copper (Cu), and may comprise oxygen, nitrogen or carbon as an element other than the metal element.

In the conductive structure according to one embodiment of the present specification, a transparent substrate may be used as the substrate, however, the substrate is not particularly limited, and glass, a plastic substrate, a plastic film and the like may be used.

According to one embodiment of the present specification, a transparent conductive layer may be further provided between the substrate and the metal layer. Specifically, according to one embodiment of the present specification, the transparent conductive layer may be provided adjoining on one surface of the substrate. In addition, according to one embodiment of the present specification, the metal layer may be provided on the transparent conductive layer.

According to one embodiment of the present specification, a transparent conductive oxide layer may be used as the transparent conductive layer. As the transparent conductive oxide, indium oxides, zinc oxides, indium tin oxides, indium zinc oxides, indium zinc tin oxides, non-crystalline transparent conductive polymers and the like may be used, and one type, or two or more types thereof may be used, however, the transparent conductive oxide is not limited thereto. According to one embodiment of the present specification, the transparent conductive layer may be an indium tin oxide layer.

According to one embodiment of the present specification, the transparent conductive layer may be a transparent electrode layer.

In the present specification, "transparent" means having visible light transmittance of 70% or greater or 80% or greater.

According to one embodiment of the present specification, the transparent conductive layer may have a thickness of 15 nm or more and 20 nm or less, however, the thickness is not limited thereto. The transparent conductive layer may be formed through an evaporation process or a printing process using materials for the transparent conductive layer described above.

According to one embodiment of the present specification, the substrate is not particularly limited, and materials known in the art may be used. According to one embodiment of the present specification, any substrate may be used as the substrate as long as it is a transparent substrate, and examples thereof may comprise glass, polyethylene terephthalate (PET), polycarbonate (PC) or polyamide (PA).

According to one embodiment of the present specification, the conductive structure may have surface resistance of 0.1Ω/☐ or more and 100Ω/☐ or less, specifically, 1Ω/☐ or more and 50Ω/☐ or less, and even more specifically, 1Ω/☐ or more and 20Ω/☐ or less.

The conductive structure having surface resistance of 1Ω/☐ or more and 100Ω/☐ or less is effective in replacing an existing transparent ITO electrode. Particularly, when the surface resistance is 1Ω/☐ or more and 50Ω/☐ or less, or 1Ω/☐ or more and 20Ω/☐ or less, surface resistance is significantly lower compared to cases of using an existing transparent ITO electrode, and therefore, a touch recognition speed may be significantly improved since RC delay is shortened when a signal is applied, and based on this, a use in a large area touch screen of 10 inch or larger may be readily accomplished.

In the conductive structure, the surface resistance of the metal layer or the light reflection reducing layer prior to patterning may be greater than 0Ω/□ and 10Ω/□ or less, greater than 0Ω/□ and 2Ω/□ or less, and specifically, greater than 0Ω/□ and 0.7Ω/□ or less. When the surface resistance is 2Ω/□ or less and particularly is 0.7Ω/□ or less, micropatterning design and manufacturing processes are smoothly progressed as the surface resistance of the metal layer or the light reflection reducing layer prior to patterning is reduced, and it is effective in increasing the reaction speed of an electrode since the surface resistance of the conductive structure after patterning is reduced. The surface resistance may be adjusted depending on the thickness of the metal layer or the light reflection reducing layer.

One embodiment of the present specification provides a method for manufacturing the conductive structure.

One embodiment of the present specification provides a method for manufacturing a conductive structure comprising preparing a substrate; forming a metal layer on the substrate; and forming a light reflection reducing layer comprising a copper-nickel oxide on at least one surface of the metal layer, wherein the light reflection reducing layer has copper content of 15 at % or more and 55 at % or less, and the light reflection reducing layer has nickel content of 1 at % or more and 30 at % or less.

In the method for manufacturing a conductive structure, descriptions on the conductive structure, the metal layer, the light reflection reducing layer, the metal pattern layer and the light reflection reducing pattern layer are the same as the descriptions provided above.

According to one embodiment of the present specification, the forming of a metal layer or a light reflection reducing layer may use methods known in the art. For example, methods such as evaporation, sputtering, wet coating, vaporization, electroplating or electroless plating, and metal foil lamination may be used for the formation, and specifically, a sputtering method may be used for the formation.

According to one embodiment of the present specification, the forming of a light reflection reducing layer may use a physical evaporation method. Specifically, the forming of a light reflection reducing layer may use a sputtering method, an E-beam evaporation method, a vaporization evaporation method or the like. For example, when forming the light reflection reducing layer, inert gases, for example, gases such as Ar may be used as a sputtering gas. In addition, when using a reactive sputtering method, a process may also be carried out through partial pressure control of reactive gases such as $O_2$.

According to one embodiment of the present specification, the forming of a light reflection reducing layer may use a sputtering method under an atmosphere of oxygen partial pressure of 30% or greater. More specifically, according to one embodiment of the present specification, the sputtering method may also be carried out under an atmosphere of oxygen partial pressure of 50% or greater.

The manufacturing method according to one embodiment of the present specification may further comprise patterning at least one of the metal layer and the light reflection reducing layer.

The method of patterning the metal layer and the light reflection reducing layer may use methods known in the art, and is not particularly limited. For example, a photoresist method may be used for patterning the metal layer. Specifically, methods of forming a photoresist pattern on the metal layer by selective exposure and development or forming a resist pattern using a printing method, and selectively etching the metal layer that is not coated by the resist pattern using the resist pattern as a mask may be used.

The manufacturing method according to one embodiment of the present specification may further comprise simultaneously patterning the metal layer and the light reflection reducing layer.

In the manufacturing method according to one embodiment of the present specification, the simultaneous patterning may be batch etching the metal layer and the light reflection reducing layer using an etchant.

In the manufacturing method according to one embodiment of the present specification, when the metal layer comprises copper, the metal layer and the light reflection reducing layer may be etched using the same etchant, which is also advantageous in that batch etching may be carried out for the metal layer and the light reflection reducing layer. Specifically, the etchant may be a Cu etchant, and Cu etchants generally used in the art may be used without limit.

One embodiment of the present specification provides a touch panel comprising the conductive structure. The touch panel may be a touch screen panel. For example, in a capacitive type touch screen panel, the conductive structure according to one embodiment of the present specification may be used as a touch sensitive electrode substrate.

In addition, one embodiment of the present specification provides a display device comprising the touch panel.

The touch screen panel according to one embodiment of the present specification may further comprise an additional structure besides the conductive structure described above. In this case, the two structures may be disposed in the same direction, or the two structures may be disposed in the opposite direction. The two or more structures capable of being comprised in the touch screen panel do not necessarily have the same structure, and it is favorable that only any one, preferably the structure closest to a user, comprises the conductive structure described above, and the structure additionally comprised does not necessarily comprise the light reflection reducing pattern layer. In addition, the laminated structures in the two or more structures may be different from each other. When two or more structures are comprised, an insulation layer may be provided therebetween. Herein, the insulation layer may additionally have a function of an adhesion layer.

The touch screen panel according to one embodiment of the present specification may comprise a lower substrate; an upper substrate; and an electrode layer provided on any one or both surfaces of the surface of the lower substrate adjoining the upper substrate and the surface of the upper substrate adjoining the lower substrate. The electrode layers may each have a function of X axis location detection and Y axis location detection.

Herein, one or both of the electrode layers provided on the lower substrate and the surface of the lower substrate adjoining the upper substrate; and the electrode layer provided on the upper substrate and the surface of the upper substrate adjoining the lower substrate may be the conductive structure according to one embodiment of the present specification described above. When only one of the electrode layers is the conductive structure according to one embodiment of the present specification, the remaining other may have a conductive pattern known in the art.

When two electrode layers are formed by providing electrode layers on one surface of both the upper substrate and the lower substrate, an insulation layer or a spacer may be provided between the lower substrate and the upper substrate so that a constant distance is maintained between the electrode layers and connection does not occur. The insulation layer may comprise an adhesive or a UV or heat curable resin. The touch screen panel may further comprise a ground connection unit connected to the pattern of the metal layer in the conductive structure described above. For example, the ground connection unit may be formed on the edge portion of a surface on which the pattern of the metal layer of the substrate is formed. In addition, at least one of an anti-reflection film, a polarizing film, a fingerprint resistance film may be provided on at least one surface of a laminate comprising the conductive structure. Other types of functional films may be further comprised besides the functional films described above depending on design specifications. Such a touch screen panel may be used in display devices such as OLED display panels, liquid crystal displays (LCD), cathode-ray tubes (CRT) and PDPs.

In the touch screen panel according to one embodiment of the present specification, a conductive pattern layer and a darkening pattern layer may be each provided on both surfaces of the substrate.

The touch screen panel according to one embodiment of the present specification may additionally comprise an electrode unit or a pad unit on the conductive structure, and herein, the effective screen unit, the electrode unit and the pad unit may be formed with the same conductor.

In the touch screen panel according to one embodiment of the present specification, the light reflection reducing pattern layer may be provided on the side at which a user looks.

One embodiment of the present specification provides a display device comprising the conductive structure. In the display device, the conductive structure according to one embodiment of the present specification may be used in a color filter substrate, a thin-film transistor substrate or the like.

One embodiment of the present specification provides a solar cell comprising the conductive structure. For example, the solar cell may comprise an anode electrode, a cathode electrode, a photoactive layer, a hole transfer layer and/or an electron transfer layer, and the conductive structure according to one embodiment of the present specification may be used as the anode electrode and/or the cathode electrode.

The conductive structure may substitute existing ITO in a display device or a solar cell, and may have a potential application in flexible products. In addition, the conductive structure may be used as a next-generation transparent electrode together with CNTs, conductive polymers, graphene and the like.

Hereinafter, the present specification will be described in detail with reference to examples. However, examples according to the present specification may be modified to various other forms, and the scope of the present specification is not construed to be limited to the examples described below. Examples in the present specification are provided for more completely describing the present specification for those having average knowledge in the art.

Example and Comparative Example

After preparing a polyethylene terephthalate (PET) substrate, a metal layer having a thickness of 100 nm was formed on the PET substrate using Cu as a source material under argon atmosphere of 2 mTorr. Further, a light reflection reducing layer was formed on the metal layer using Cu—Ni as a source material under an atmosphere of oxygen partial pressure of 50% and 3 mTorr. Specifically, while varying the Ni content in the source material, a light reflection reducing layer formed with a copper-nickel oxide having a thickness of 30 nm as in the following Table 1 was formed on the metal layer to manufacture a conductive structure.

The examples and the comparative examples are for examining performance of the conductive structure, and a patterning process was not comprised.

TABLE 1

| | Ni content in Cu—Ni Source Material (wt %) | Atomic % | | |
|---|---|---|---|---|
| | | O | Ni | Cu |
| Comparative Example 1 | 0 | 48 | 0 | 52 |
| Example 1 | 2 | 48 | 1 | 51 |
| Example 2 | 4 | 48 | 3 | 49 |
| Example 3 | 11 | 48 | 7 | 45 |
| Example 4 | 31 | 50 | 20 | 30 |
| Example 5 | 45 | 53 | 29 | 18 |
| Comparative Example 2 | 71 | 52 | 33 | 15 |
| Comparative Example 3 | 85 | 53 | 40 | 7 |

FIG. 5 shows results of measuring a refractive index (n) of the light reflection reducing layer of the conductive structures manufactured according to the examples and the comparative examples.

FIG. 6 shows results of measuring an extinction coefficient (k) of the light reflection reducing layer of the conductive structures prepared according to the examples and the comparative examples.

% in FIG. 5 and FIG. 6 means Ni content (%) in the Cu—Ni source material in Table 1.

[Test Example 1]—Heat Resistance Test

For each of the conductive structures manufactured according to the examples and the comparative examples as in Table 1, changes in the reflectivity in a wavelength range of 380 nm to 780 nm were measured after 1 hour under a high temperature atmosphere of 150° C. The amounts of changes in the average light reflectivity of the examples and the comparative examples according to Test Example 1 are as shown in the following Table 2.

TABLE 2

| | Ni content in Cu—Ni Source Material (wt %) | Amount of Change in Average Light Reflectivity (%) |
|---|---|---|
| Comparative Example 1 | 0 | 26.1 |
| Example 1 | 2 | 9.2 |
| Example 2 | 4 | 5.8 |
| Example 3 | 11 | 2.4 |
| Example 4 | 31 | 2.4 |
| Example 5 | 45 | 8 |
| Comparative Example 2 | 71 | 11.5 |
| Comparative Example 3 | 85 | 14.1 |

Based on the results of Table 2, it was seen that, in the conductive structure according to one embodiment of the present specification, changes in the optical properties hardly occurred in the light reflection reducing layer even after the heat resistance test, and specifically, the amount of change in the average light reflectivity was 10% or less. Accordingly, it can be seen that the conductive structure according to one embodiment of the present specification is capable of maintaining excellent performance even under a high temperature environment that may be created during a manufacturing process or during the use of products.

[Test Example 1-1]—Heat Resistance Test

For each of the conductive structures according to Example 5 and Comparative Example 1, changes in the physical properties were measured after 24 hours under a high temperature atmosphere of 150° C.

FIG. 7 shows reflectivity of the conductive structures before and after the heat resistance test according to Test Example 1-1.

FIG. 8 shows color changes in the light reflection reducing layer of the conductive structures before and after the heat resistance test according to Test Example 1-1.

FIG. 9 shows surface conditions of the light reflection reducing layer of Example 5 before and 3 hours after the heat resistance test according to Test Example 1-1.

FIG. 10 shows surface conditions of the light reflection reducing layer of Comparative Example 1 before and 3 hours after the heat resistance test according to Test Example 1-1.

Based on the results of FIG. 7 to FIG. 10, it was seen that, in the conductive structure according to one embodiment of the present specification, changes in the optical properties of the light reflection reducing layer hardly occurred even after the heat resistance test, and color changes and surface condition changes hardly occurred as well in the light reflection reducing layer. Accordingly, it can be seen that the conductive structure according to one embodiment of the present specification is capable of maintaining excellent performance even under a high temperature environment that may be created during a manufacturing process or during the use of products.

[Test Example 2]—Salt Water Resistance Test

The conductive structures manufactured according to Example 5 and Comparative Example 1 were each under an atmosphere of 25° C. and 5 mass % of NaCl solution spray, and the states of the conductive structures were measured after 12 hours passed by.

FIG. 11 shows transmittance of the conductive structures after the salt water resistance test according to Test Example 2. Transmittance in FIG. 11 may be the same as transmittance of the light reflection reducing layer. In addition, transmittance of the conductive structures according to Example 5 and Comparative Example 1 prior to the salt water resistance test was 0% in the whole wavelength region.

Based on the results of FIG. 11, it was seen that, in the conductive structure according to one embodiment of the present specification, changes in the light transmittance were not substantial even after the salt water resistance test. This means that physical properties of the light reflection reducing layer did not change much even after the salt water resistance test, and the light reflection reducing layer is capable of smoothly performing a function as a light reflection reducing layer.

[Test Example 3]—Isothermal-Isohumidity Test

The conductive structures manufactured according to Example 5 and Comparative Example 1 were each under a high temperature-high humidity atmosphere of 85° C. and relative humidity of 85%, and the states of the conductive structures were measured after 10 days passed by.

FIG. 12 shows changes in the light reflectivity of the conductive structure of Example 5 before and after the isothermal-isohumidity test according to Test Example 3.

FIG. 13 shows changes in the light reflectivity of the conductive structure of Comparative Example 1 before and after the isothermal-isohumidity test according to Test Example 3.

Based on the results of FIG. 12 and FIG. 13, it was seen that the conductive structure according to Example 5 had almost no changes in the light reflectivity even after the isothermal-isohumidity test, however, the conductive structure according to Comparative Example 1 had considerable changes in the light reflectivity. Accordingly, it means that, in the light reflection reducing layer of the conductive structure according to one embodiment of the present specification, changes in the physical properties of the light reflection reducing layer were not substantial even after the salt water resistance test, and the light reflection reducing layer is capable of smoothly performing a function as a light reflection reducing layer.

The invention claimed is:

1. A conductive structure comprising:
   a substrate;
   a metal layer provided on the substrate; and
   a light reflection reducing layer comprising a copper-nickel oxide provided on at least one surface of the metal layer,
   wherein the light reflection reducing layer has copper content of 15 at % or more and 55 at % or less; and
   the light reflection reducing layer has nickel content of 1 at % or more and 30 at % or less.

2. The conductive structure of claim 1, wherein, in the light reflection reducing layer, a ratio of the nickel content to the copper content (Ni (at %)/Cu (at %)) is 0.01 or more and 1.8 or less.

3. The conductive structure of claim 1, wherein reflectivity on a surface of the light reflection reducing layer is 40% or less in light having a wavelength of 600 nm.

4. The conductive structure of claim 1, wherein the light reflection reducing layer has a refractive index (n) of 2 or more and 2.4 or less in light having a wavelength of 600 nm.

5. The conductive structure of claim 1, wherein the light reflection reducing layer has an extinction coefficient (k) of 0.3 or more and 1.2 or less in light having a wavelength of 600 nm.

6. The conductive structure of claim 1, wherein the light reflection reducing layer has a thickness of 10 nm or more and 100 nm or less.

7. The conductive structure of claim 1, wherein an amount of change in the average light reflectivity of the light reflection reducing layer is 10% or less in a wavelength range of 380 nm to 780 nm after 24 hours under a high temperature atmosphere of 150° C.

8. The conductive structure of claim 1, wherein light transmittance of the light reflection reducing layer is 20% or less in light having a wavelength of 600 nm after 12 hours under an atmosphere of 25° C. and 5 mass % of NaCl solution spray.

9. The conductive structure of claim 1, wherein an amount of change in the average light reflectivity of the light reflection reducing layer is 20% or less after 10 days under a high temperature-high humidity atmosphere of 85° C. and relative humidity of 85%.

10. The conductive structure of claim 1, wherein the metal layer is a metal pattern layer comprising a plurality of openings and a conductive line dividing the openings.

11. The conductive structure of claim 1, further comprising an additional metal layer between the substrate and the metal layer.

12. The conductive structure of claim 1, further comprising a transparent conductive layer between the substrate and the metal layer.

13. The conductive structure of claim 1, which has a structure in which the substrate, the metal layer and the light reflection reducing layer are consecutively laminated in this order; a structure in which the substrate, the light reflection reducing layer and the metal layer are consecutively laminated in this order; or a structure in which the substrate, the light reflection reducing layer, the metal layer and the light reflection reducing layer are consecutively laminated in this order.

14. A touch panel comprising the conductive structure of claim 1.

15. A display device comprising the touch panel of claim 14.

16. A method for manufacturing a conductive structure comprising:
preparing a substrate;
forming a metal layer on the substrate; and
forming a light reflection reducing layer comprising a copper-nickel oxide on at least one surface of the metal layer,
wherein the light reflection reducing layer has copper content of 15 at % or more and 55 at % or less, and the light reflection reducing layer has nickel content of 1 at % or more and 30 at % or less.

17. The method for manufacturing a conductive structure of claim 16, wherein the forming of a light reflection reducing layer uses a physical evaporation method.

18. The method for manufacturing a conductive structure of claim 16, wherein the forming of a light reflection reducing layer uses a sputtering method under an atmosphere of oxygen partial pressures of 30% or greater.

19. The method for manufacturing a conductive structure of claim 16, further comprising simultaneously patterning the metal layer and the light reflection reducing layer.

20. The method for manufacturing a conductive structure of claim 19, wherein the simultaneous patterning is batch etching the metal layer and the light reflection reducing layer using an etchant.

* * * * *